(12) United States Patent
Stautner

(10) Patent No.: US 6,490,871 B1
(45) Date of Patent: Dec. 10, 2002

(54) MRI OR NMR SYSTEMS

(75) Inventor: Wolfgang Stautner, Oxford (GB)

(73) Assignee: Oxford Magnet Technology Limited, Oxen (GB)

( * ) Notice: Subject to any disclaimer, the term of this patent is extended or adjusted under 35 U.S.C. 154(b) by 0 days.

(21) Appl. No.: 09/157,407

(22) Filed: Sep. 21, 1998

(30) Foreign Application Priority Data

Sep. 30, 1997 (GB) ............................................. 9720640

(51) Int. Cl.⁷ ................................................. F25B 19/02
(52) U.S. Cl. ....................................................... 62/51.1
(58) Field of Search ............................. 62/6, 51.1, 48.2

(56) References Cited

U.S. PATENT DOCUMENTS

| | | | | |
|---|---|---|---|---|
| 4,223,540 A | * | 9/1980 | Longsworth | 62/51.1 |
| 4,777,807 A | * | 10/1988 | White | 62/51.1 |
| 4,796,433 A | * | 1/1989 | Bartlett | 62/51.1 |
| 5,442,928 A | * | 8/1995 | Laskaris et al. | 62/51.1 |
| 5,515,685 A | * | 5/1996 | Yanai et al. | 62/6 |
| 5,530,413 A | * | 6/1996 | Minas et al. | 62/51.1 |
| 5,613,365 A | * | 3/1997 | Mastrup et al. | 62/6 |
| 5,642,624 A | * | 7/1997 | Gore | 62/51.1 |
| 5,657,634 A | * | 8/1997 | Woods | 62/51.1 |
| 5,711,156 A | * | 1/1998 | Matsui et al. | 62/6 |
| 5,735,127 A | * | 4/1998 | Pfotenhauer et al. | 62/6 |
| 5,744,959 A | | 4/1998 | Jeker et al. | 324/319 |
| 5,782,095 A | * | 7/1998 | Chen | 62/51.1 |

FOREIGN PATENT DOCUMENTS

| | | |
|---|---|---|
| DE | 196 48 253 | 6/1998 |
| EP | 0 260 036 | 3/1988 |
| EP | 0 780 698 | 6/1997 |
| GB | 2 301 174 | 11/1996 |
| GB | 2 301 426 | 12/1996 |
| GB | 2 330 194 | 4/1999 |

OTHER PUBLICATIONS

Matsubara et al., "Multi–staged Pulse Tube Refrigerator for Superconducting Magnet Applications", Cryogenics vol. 34 ICEC Supplement, pp. 155–158 (1994).

Richardson, "Development of a Practical Pulse Tube Refrigerator: Co–axial Designs and the Influence of Viscosity", Cryogenics, vol. 28, pp. 516–520 (1988).

* cited by examiner

Primary Examiner—Ronald Capossela
(74) Attorney, Agent, or Firm—Crowell & Moring LLP

(57) ABSTRACT

The present invention relates to a cooling system for a cryostat incorporating a pulse tube refrigerator 8. The cryostat usually consists of several interior cylindrical or oval-shaped vessels for storing liquids. The cryostat for MRI/NMR applications and related fields usually comprises an outer vacuum case, a nitrogen can or a radiation shield instead, and a further radiation shield and the helium vessel housing 4 the superconducting magnet 2. The magnet usually is made of NbTi, Nb3Sn, or some HTC conductor or a combination of both.

The present invention uses a pulse tube refrigerator 8, the so-called pulse tube cooler, which essentially comprises an empty tube and a further tube housing the regenerator material for the cooler, which is inserted into any opening of a cryostat. The opening is defined as e.g. the neck-tube 6 or any other location required for accessing the cryostat, e.g. for the transfer of liquids, for energising the magnet, an opening acting as a pressure relief or most simply as a drainage outlet in case of storage vessel for cryogenic fluids.

24 Claims, 7 Drawing Sheets

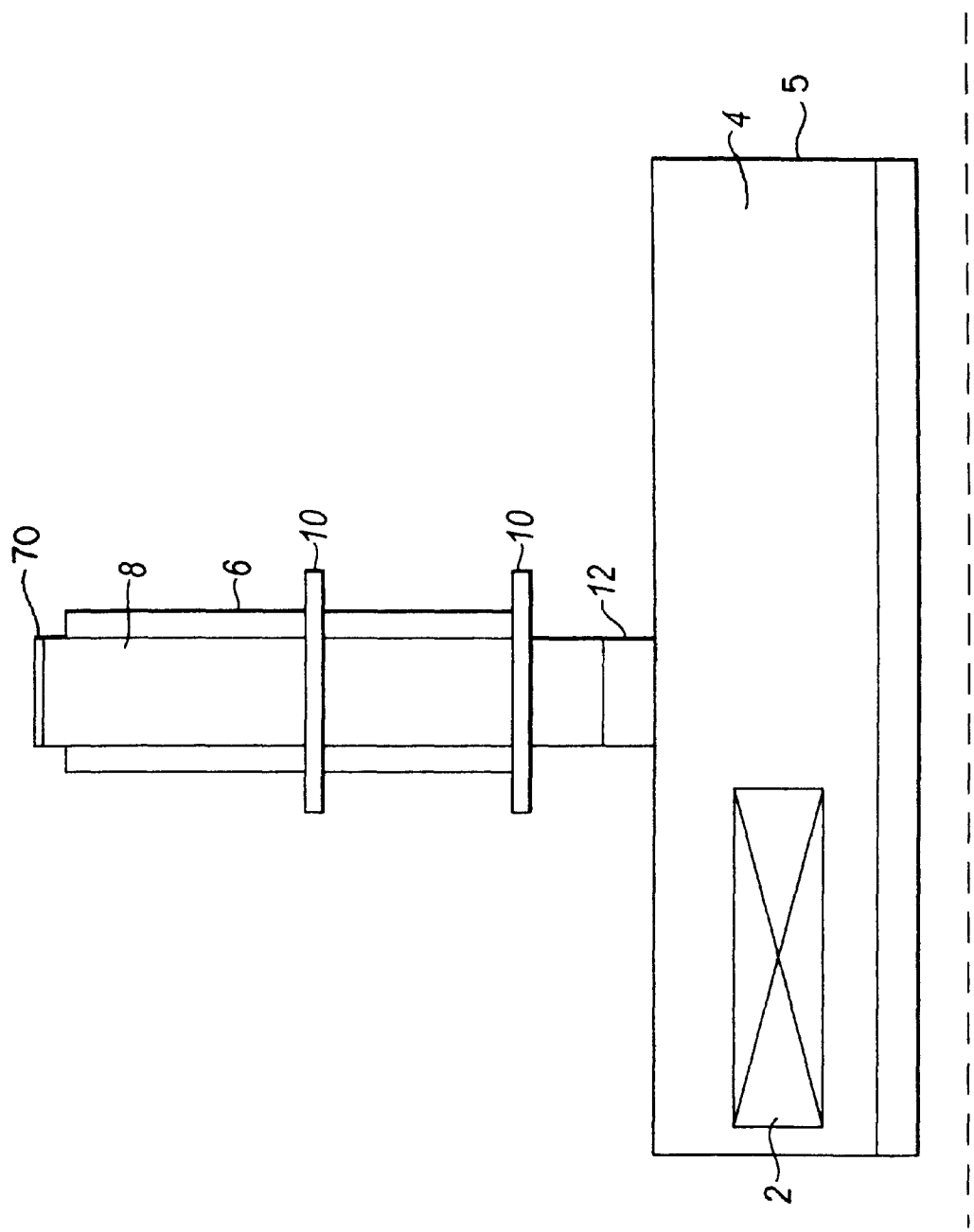

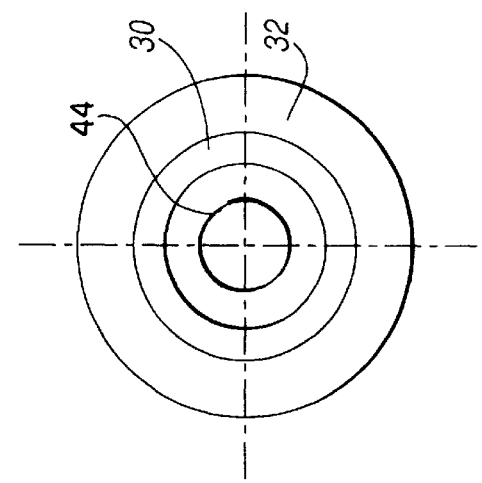
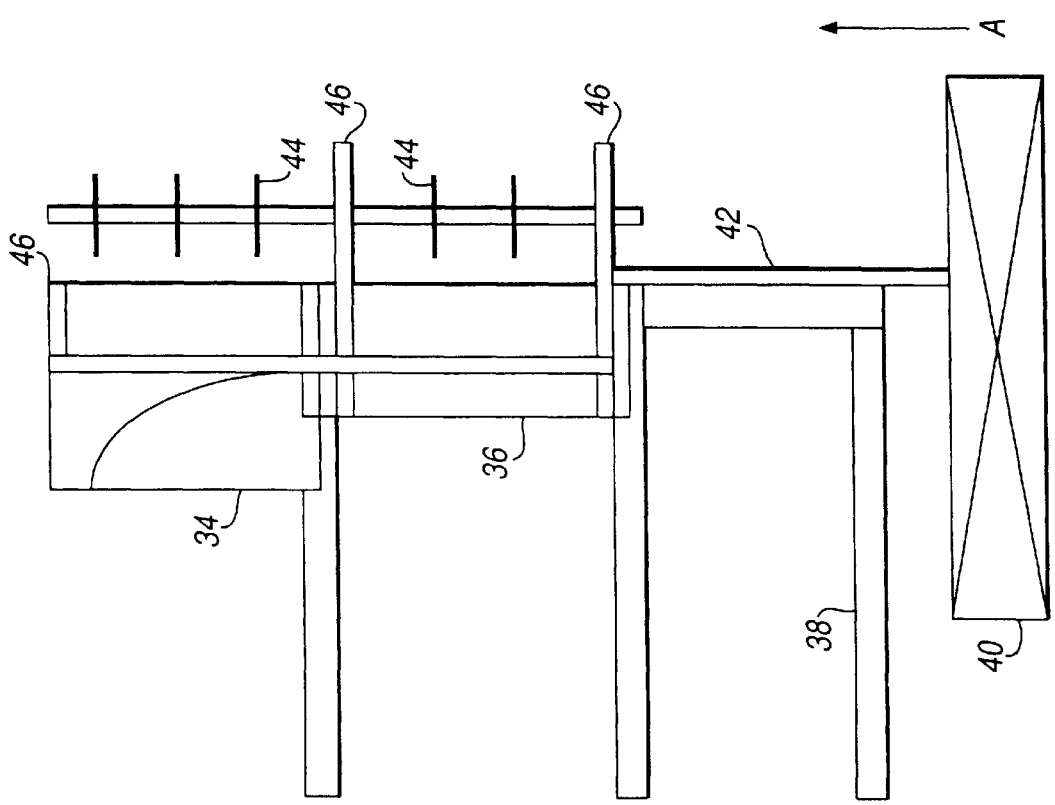

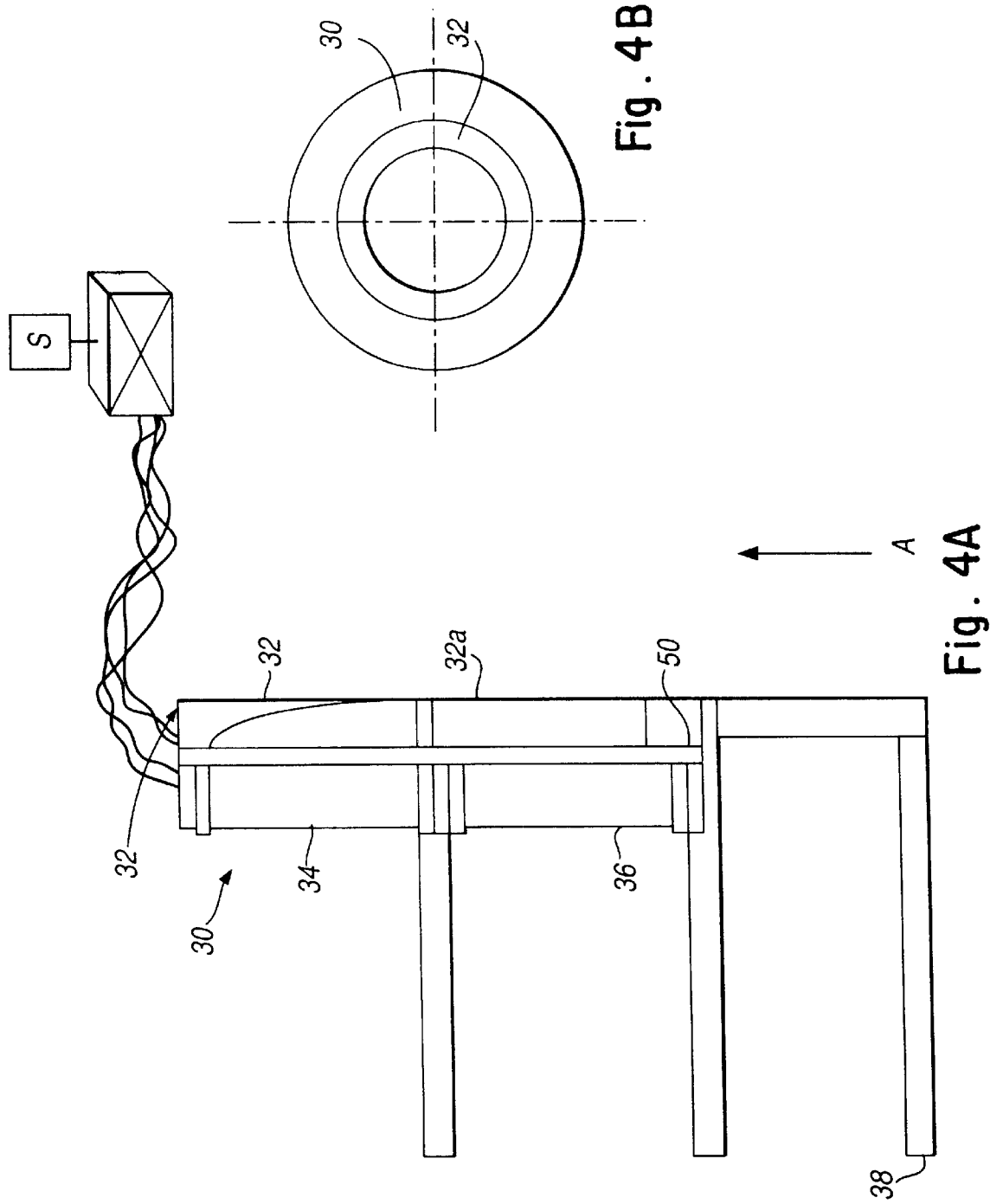

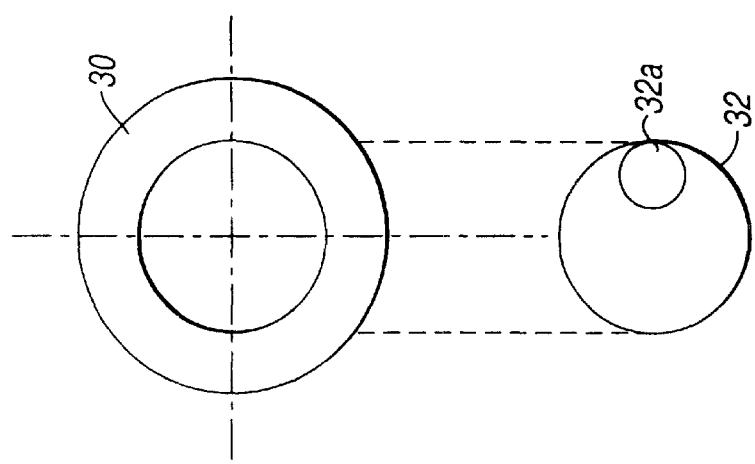
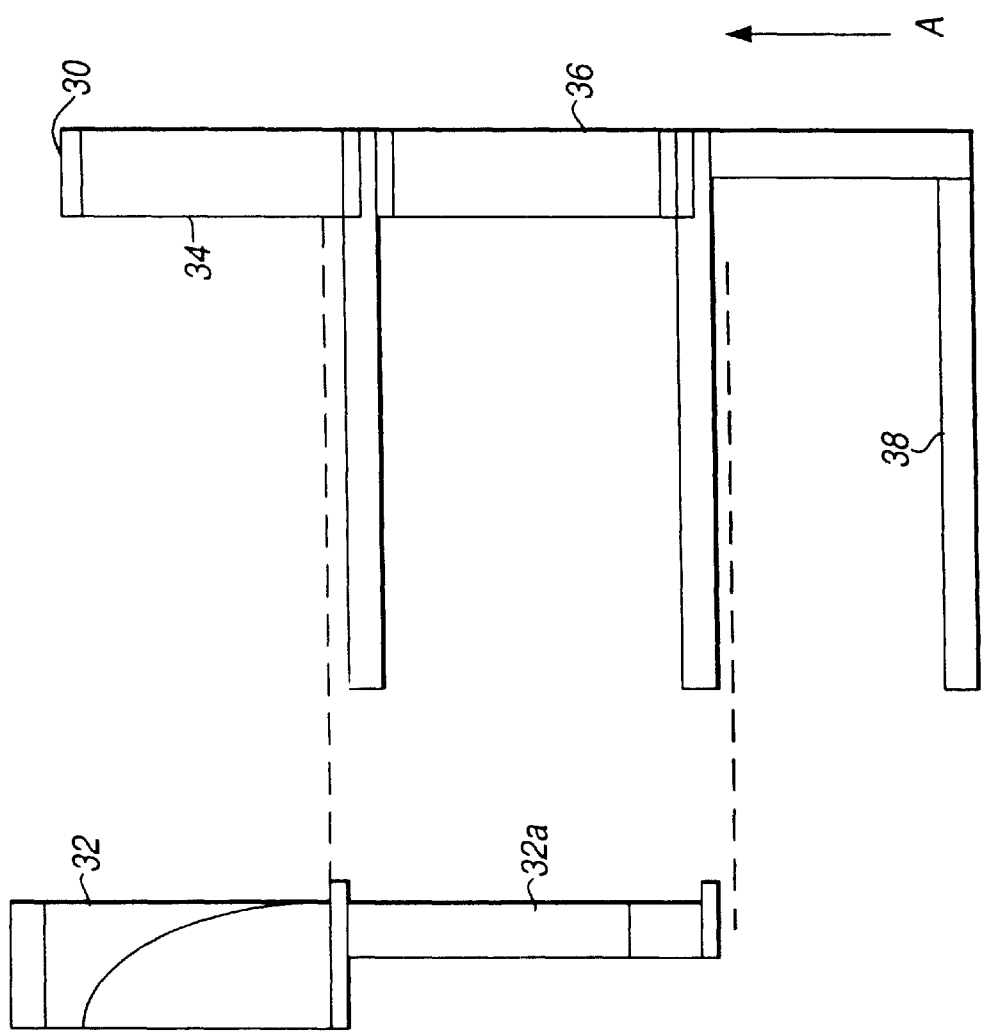

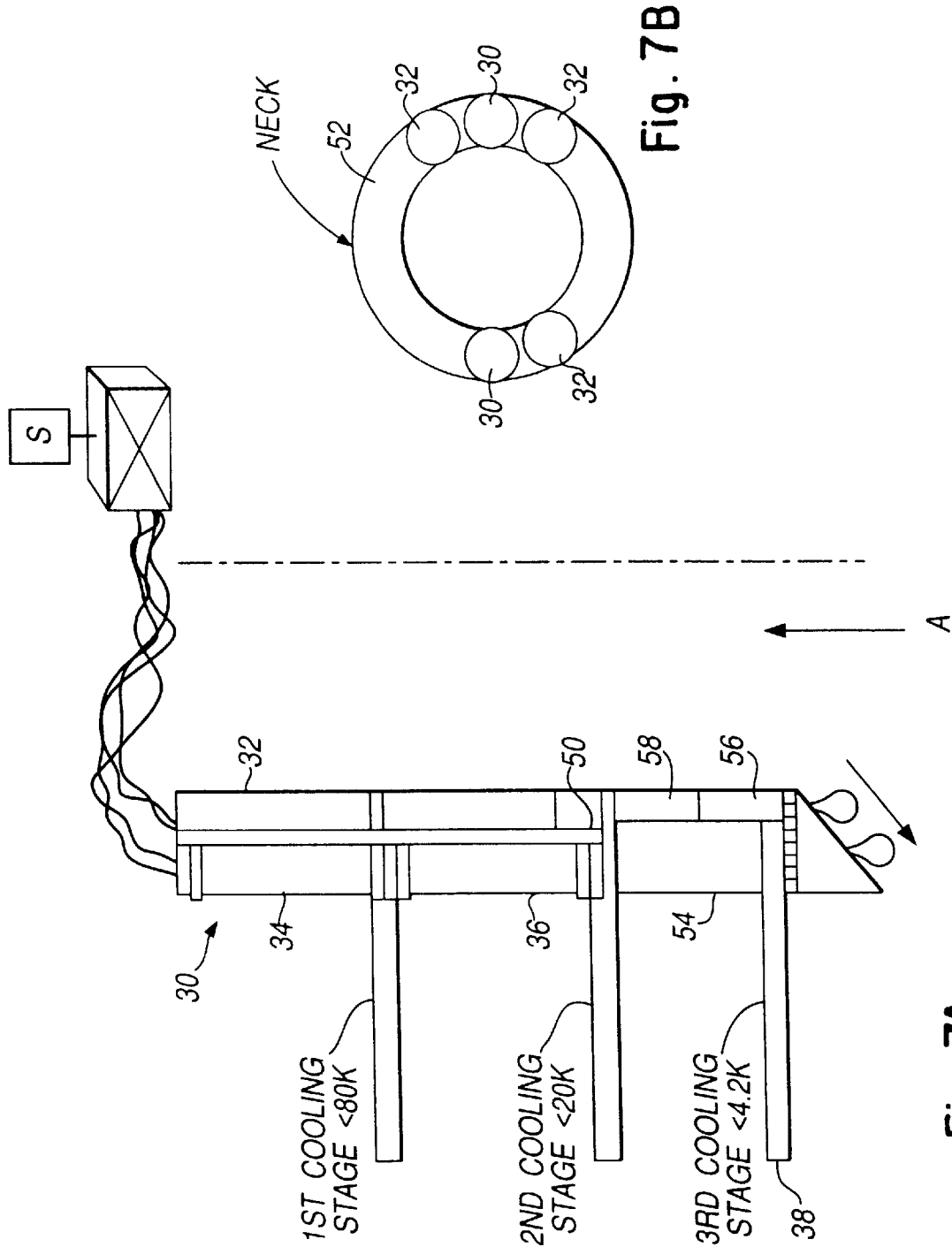

MRI OR NMR SYSTEMS

BACKGROUND OF THE INVENTION

The present invention relates to the use of coaxial pulse tube refrigerators in MRI or NMR systems, particularly in the neck tube of such systems.

Coaxial pulse tube refrigerators are described in a paper entitled "Development of a Practical Pulse Tube Refrigerator: Coaxial design and the influence of viscosity' by R. N. Richardson in Cryogenics 1988 Vol. 28 August, pages 516–520. A pulse tube refrigerator (PTR) comprises two tubes, a pulse tube and a regenerator tube, in which an oscillating pressure-wave of gas produces the cooling effect. The paper states that the concentric pulse tube design provides a convenient, compact configuration for achieving high heat pumping rates. Instead of placing the regenerator concentrically around the pulse tube which is the preferred configuration, the pulse tube occupies the annular space and surrounds the regenerator at the center.

One object of the present invention is to incorporate a coaxial pulse tube refrigerator into the neck portion of an MRI and NMR system.

SUMMARY OF THE INVENTION

According to the present invention there is provided an MRI or NMR system comprising a magnet assembly immersed in a cooling liquid contained within a vessel, and having an orifice in the form of a neck-tube. The neck-tube is adapted to house a pulse tube refrigerator which is in the form of an annulus or a section of an annulus.

The pulse tube refrigerator may have an enhanced surface structure which is either a natural or an artificial structure.

The pulse tube refrigerator has its regenerator tube in the form of an annulus which is concentric and coaxial and in contact with either the inside or outside of its pulse tube.

The regenerator tube or pulse tube may also act as a suspension element.

Figure 2A:
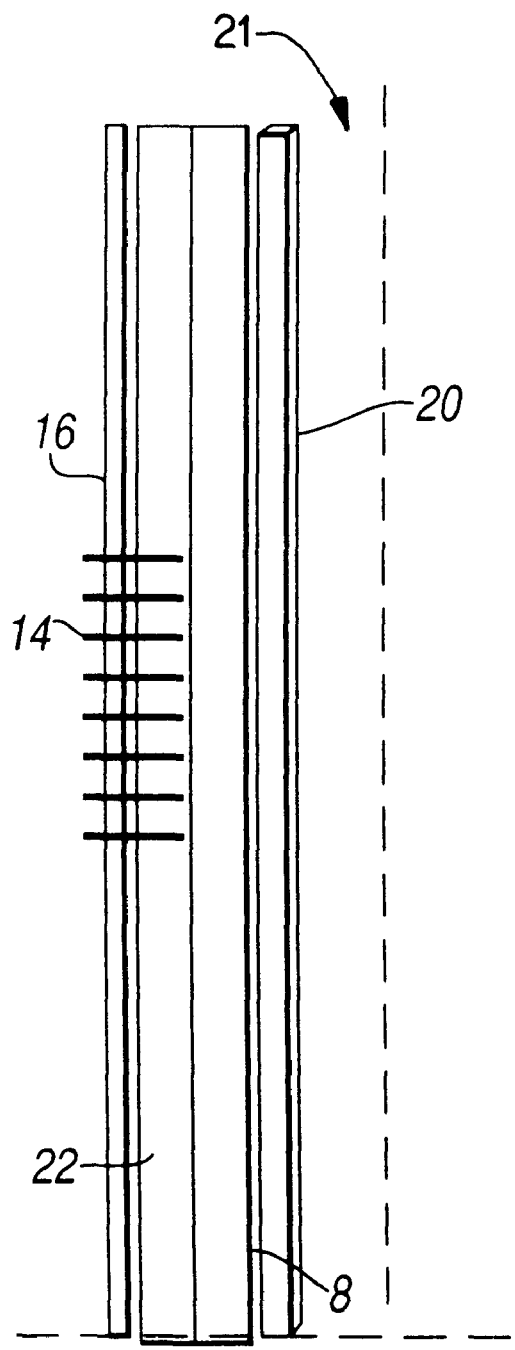
Figure 2B:
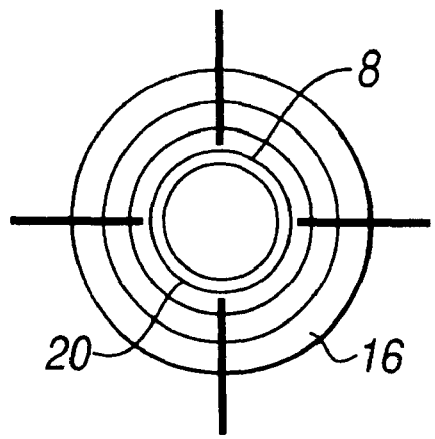

A preferred embodiment of the invention will now be described with reference to the accompanying drawings, wherein:

FIG. 1 shows part of an MRI or NMR system having a neck-tube incorporating a pulse tube refrigerator, FIGS. 2A and 2B are a partial longitudinal section and a transverse section, respectively, which show several ways in which the surface of a pulse tube refrigerator can be enhanced, FIGS. 3A and 3B are a partial longitudinal section and a transverse section, respectively, which show a section of a neck-pulse tube refrigerator, where the pulse tube and a regenerator tube are of annular shape, FIGS. 4A and 4B are a partial longitudinal section and a transverse section, respectively, which show an alternative form of neck-pulse tube refrigerator to that shown in FIG. 3, FIG. 5A and 5B are a partial longitudinal section and a transverse, respectively, which show a section o a neck-pulse tube refrigerator, where the pulse tube and regenerator tube are separated.

Figures 6A, 6B:
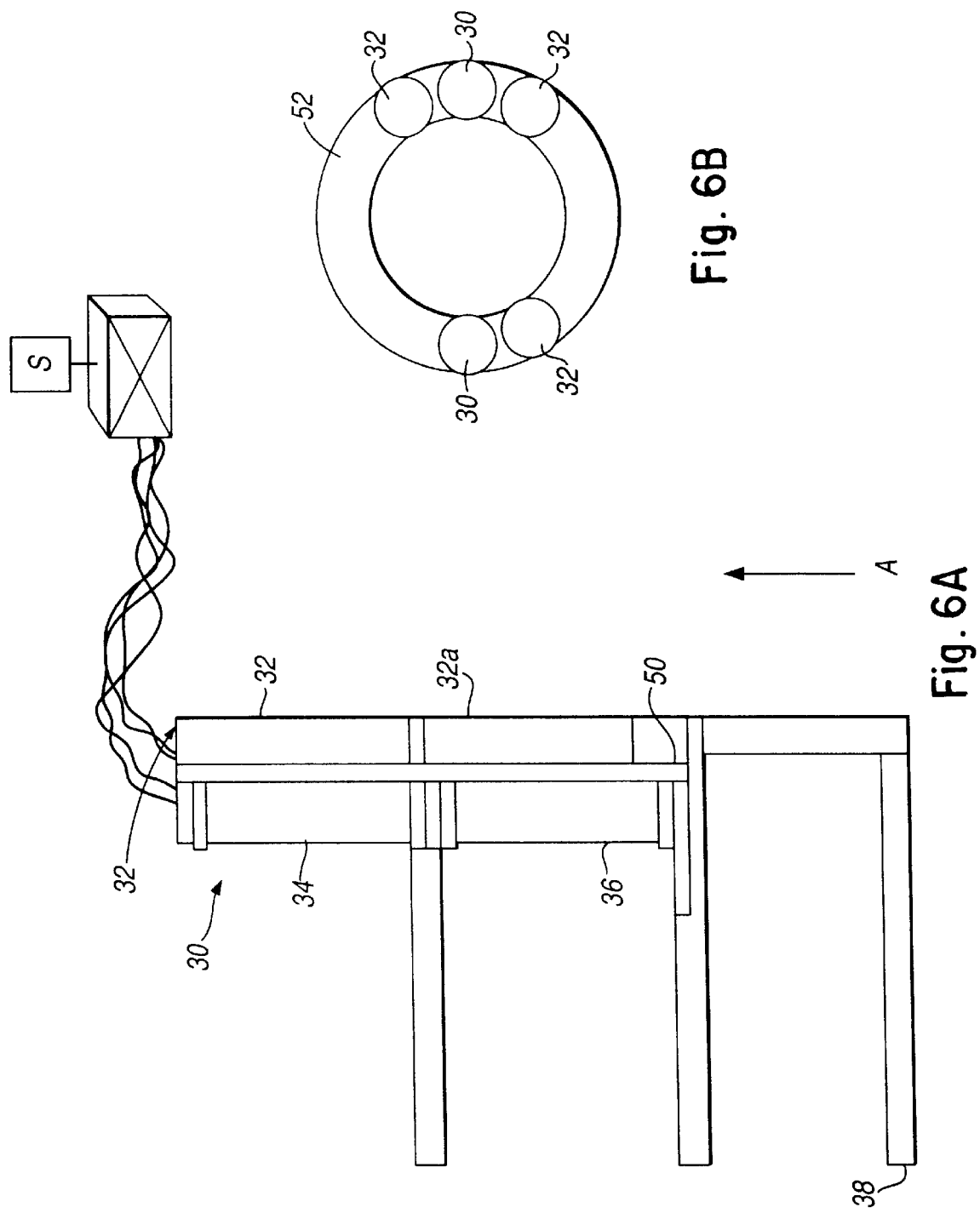

FIGS. 6A and 6B are a partial longitudinal section and a transverse, respectively, which show a section of a neck-pulse tube refrigerator, where the pulse tube and regenerator tube are of a circular shape and occupy part of a neck tube, and, FIGS. 7A and 7B are a partial longitudinal section and a transverse, respectively, which show a section of a three-stage neck-pulse tube refrigerator liquefier.

DETAILED DESCRIPTION OF THE DRAWINGS

Referring to FIG. 1, part of an MRI or NMR cryostat system is shown wherein a magnet structure 2 is immersed in a liquid helium bath 4 in a vessel 5. A neck-tube 6 extends from the bath 4, into which a coaxial pulse tube refrigerator 8 is inserted. The neck-tube is provided with contacts 10 to which the thermal shields are connected. The pulse tube refrigerator 8 may be a single stage or multistage pulse tube refrigerator which also serves to cool the shields. The neck-tube may also incorporate a baffle insert 12 to prevent "funnelling", and may be made from any of the following materials, e.g., steel, titanium allow or epoxy resin.

The above mentioned paper discusses typical arrangements of the various pulse tube designs. The pulse tube refrigerator is of annular or circular design, and is aptly suitable for incorporation into an annular opening of a cryostat.

An annular opening for example, would be the neck-tube 6 of the cryostat itself, which is used for accessing varying parts of the magnet or for having access to the liquids or for filling or emptying purposes. Some MRI light-weight or next-generation NMRI systems enable the system to be totally suspended at the cryostat neck or at any other opening. The neck or said opening has to be of fairly rigid design, which would add to the overall heat input of the helium or nitrogen vessel or radiation shield. In case the neck-tube is not designed as a low heat-conducting material, the heat input is increased resulting in a higher boil-off and reduced hold times of the cryostat. For this response the neck tube in storage tanks for liquid nitrogen or helium are often made of epoxy composite tubes.

Another way to reduce the additional heat leak into a cryostat caused by the stainless steel neck tube most widely used in MRI and NMR systems, is to either cool the neck tube by escaping helium gas which is in good contact with the tube wall, or by other external means, e.g., by using so-called shield coolers, where the neck is also linked to the radiation shields by means of copper links, as is known from European patent application 0260036.

The present invention combines the two functions of a cryocooler, namely the suspension of the radiation shields in a cryostat and their cooling.

In the case where a suspension of the mass onto the neck-tube would not be feasible because of the design, this tube is only meant to act as an integrated, invisible shield cooler.

The present invention provides the following advantages when designing a pulse tube as an annular neck-tube system. For example, some types of pulse tubes are still orientation-dependent due to the existence of convection currents and various thermal effects, which also means that a vertical or slight oblique angle most probably less than 30° would be the optimum working position with most present-day pulse tube refrigerators. The present invention can be used in the same range of angles. A further advantage of design is that the neck-tube pulse tube refrigerator could be designed in a very compact manner and the additional shortcomings of a GM-type cooler, e.g. having to insert an additional sleeve for indirectly coupling the cryocooler to the radiation shields can be dispensed with.

The necessity of a sleeve interface arises from the fact that the GM-cooler has to be serviced at certain maintenance intervals and also because of the fact that vibrations are introduced into the system which require indirect coupling to the radiation shield by means of copper braids. The average diameter of such an open window from the outer vacuum case down to the radiation shield or down to the helium vessel is approximately 150 to 200 mm, and thus also contributes to an increased boil off.

However, in the neck-tube pulse tube refrigerator, the heat-stationing is a straight-forward process. Moreover the position of the neck, which is normally located at the cryostat centre or close to the centre, is regarded as being the most efficient with respect to the overall temperature distribution around the shields. The neck-tube pulse tube refrigerator enables one to reach a compact design, as the diameter of a typical neck tube would be only around 60 to 120 mm, and the annulus comprising the pulse tube typically would be 5 to 10 mm; in addition a second annulus could be introduced of approximately the same size, which could house the regenerator. This also provides an easy way to make thermal contact to the shields, where the shields could rest on the thermal links. A direct link for suspending the radiation shields and/or a magnet and the shields has not been feasible up to now because of the vibrations induced by piston-driven coolers.

The absence of moving parts in a pulse tube cryocooler enables the design to be radically different from previous ones. The ability to directly couple this type of cooler to the surrounding structure of the cryostat reduces the vibrations to the system to a minimum, which is not the case with piston-driven systems where artifacts would show up when taking the MRI or NMR measurement.

Due to the absence of these moving parts, apart from the travelling pressure wave down the tube, the induced level of vibrations transmitted to the internal cryostat structure is several orders of magnitude lower than with piston-driven coolers. Thus it is possible to make use of the whole spectrum of directly contacting or coupling the radiation shields to a cooler, such as soldering, bolting, screwing, clamping, gluing, welding, sliding, pressing, or by means of shrink-fitting or spring-loading or mechanically by using a lever-actuated contacting system. It is therefore possible in accordance with the present invention to use the neck-pulse tube efficiently as a suspension system.

Also the cold end of such pulse tube refrigerators could be designed using a material with a negative thermal expansion coefficient in order to balance shrinkage effects.

Furthermore, the external and internal surfaces of the neck-tube pulse tube refrigerator could be thermally isolated and reinforced to enable the neck tube to carry the magnet as well as shield loads. In doing so, there is of course also no longer any further need to have a second or third turret incorporated in an outer vacuum vessel which in turn also eases operation of the cryostat at the customer's site and reduces boil-off due to the absence of heat windows, which are totally closed in the present invention. Preferqably the contact stages 10 (e.g. length approximately 20 mm) could be left out from being reinforced. In this case, sufficient heat transfer area should be made available at that position, so as to allow the cooling helium or any other gas to exchange heat with the thermal links of the neck tube cooler which in turn would reduce the power required for the PTR to cool the radiation shields.

It is self-explanatory that a dual annular-type neck-tube pulse tube refrigerator could have the outer circumferential wall of the pulse tube cooler of an enhanced or increased wall thickness to carry the shield and magnet loads, whereas the inner tube wall could be of thin-walled design. Another approach to the problem would be to make the inner annular tube of the pulse tube more rigid as this tube already has to bear the external pressure acting on the tube which could, if designed reasonably rigidly carry the aforementioned cryostat loads and all the additionally imposed loads on the cryostat as for example the different loads depending on the mode of transport or stresses imposed during cooldown and ramping of the magnet or seismic excitation or permanently fixing the position of the radiation shields as well as other thermal transient stresses. Also, the wall thickness for both annuli has to be considered in order to achieve optimum cooling power on the pulse tube stages.

A sturdy and rigid neck-tube could be provided such that internal pressures of more than typically 20 bars could be sustained and this could be achieved by reinforcing the pulse tube refrigerator 8 as shown in FIGS. 2A and 2B. Reinforcement could be achieved by means of ribs, or radial stiffeners 4 supporting a further tube 16, which surrounds the regenerator tube 22, and these stiffeners may be orientated along the vertical or horizontal axis. The pulse tube 23 could also be strengthened by an external epoxy resin composite or other coating 20.

An additional advantage of this type of pulse tube geometry is that it still allows one to make use of the opening 21 and the free access to the cryostat. Thus it offers all the advantages a neck offers in general, such as a free opening in case of a quench where the neck-tube is acting as a quench gas outlet an thus also could be equipped most conveniently with a bursting disk 70 (FIG. 1), whilst it further allows one to have or be able to have access to the magnet for inserting current leads and syphons, and at the same time reducing by means of heat stationing the heat input of the neck-tube and its internal and external attachments e.g. diagnostics facilities and many more. The other advantage is that this opening still could be used for inserting a baffle system to prevent so-called "funnelling" from the top of the turret. This baffle system could also be used such that the baffles are contacted preferably to the neck-pulse tube stages in order to minimize heat input into the system from the warm end. As has been mentioned above, this typical arrangement also enables one to heat-station various diagnostics tubes or permanently fixed tubes such as current leads etc.

The outer circumferential areas of the pulse tube do not take part in the heat transfer process, and would therefore not interfere with the surface heat pumping effect.

However, provision must be made for optimising the annular geometry, in order to reduce the pressure drop resulting from the annular design of the pulse tube as this pressure drop is higher than with circular tubes.

The heat-pumping effect may work differently with an annular-type pulse tube which is due to the now enhanced surface area which is of course larger than in a plain circular pulse tube. In contrast to piston-driven cryocoolers, a pulse tube offers a great degree of freedom in design, this applies not only to the pulse tube itself but also to the regenerator tube. For example, an etched regenerator design could easily be inserted in an annular-type pulse tube refrigerator as well as the normally used lead shot balls with a typical range in diameter of 0.2 to 0.5 mm.

Furthermore, the surface of the pulse tube itself could be changed in order to enhance or optimise the heat transfer to the surrounding, pulsating gas flow.

Also the friction factor of the pulse tube wall could be adjusted such that heat transfer and pressure drop are optimised. This could be achieved by introducing surface liners which increase or reduce the surface roughness as desired.

To balance out different heat pumping surfaces, the surface which shows poorer heat transfer characteristics could be enhanced by applying an artificial surface roughness or by sandblasting or by any other means which are generally applicable in heat transfer enhancement and are within the scope of the present invention.

Also the arrangement of pulse tube and regenerator tube could be made such that the regenerator is housed in the inner annulus and the pulse tube occupies the outer annulus of the tube arrangement shown in FIG. 1. Both annuli could be either in direct contact with each other or, if necessary, be thermally isolated by means of a thermal isolator (e.g. epoxy or nylon lining). The regenerator tube can be designed such that an external pressure applied to the inner pulse tube is supported by the regenerator tube. This tube could also be designed more rigidly and used to support either shield loads and/or the magnet system as shown in FIGS. 2A and 2B. Depending on the regenerator fuse material, the regenerator fuse can be designed to carry additional radial loads. If necessary, the outside of the inner tube also could be reinforced by ribs or other reinforcement methods, and the same applies to the internal surface of the regenerator tube, provided the gas flow is not too restricted.

The neck tube could also be designed such that only a part of the neck tube, e.g. a section of the annulus is being used for the cooler design.

In a case where the neck tube has to be equipped with one bellow at the cold end the radiation shields could still be affixed to the neck tube.

Furthermore, the neck pulse tube refrigerator geometry permits a direct thermal coupling in order to extract heat from permanently installed tubes such as fixed or temporarily fixed current leads which would otherwise be contributing to increased boil-off from the helium vessel. This is of utmost important as the same applied before with respect to the piston-driven systems and direct coupling.

The present invention can be extended to multi-stage pulse tube refrigerators where such a system would be most conveniently used for liquefaction. While closing all other surfaces there is still an opening available in case of quench or for depressurising or pressurisation of the cryostat.

The pulse tube could either be of one or two-stage annular-type design where a 'third' stage comprises a circular tube which also partly carries the magnet load.

If a three-stage pulse tube is used, this tube would also be connected to a commercial heat exchanger for the purpose of liquefaction.

Besides the application with MRI and related systems the principle applies to NMR systems.

In this case, the neck-tube pulse tube refrigerator is designed such that the number of necks to be used for suspending the overall cryostat structure comprising shield weight loads as well as magnet loads could be reduced to a minimum.

This would dramatically reduce the boil-off; as is known with present-day NMR systems the boil-off depends to a great extent on the overall heat distribution of the neck geometry causing an increase of temperature in the radiation shields and thus indirectly contributing to the overall helium boil-off.

Thus again, the neck-like pulse tube refrigerator is actually an invisible, integral part of the overall cryostat.

The benefits of the present invention are as follows:

A vertical or slight oblique angle is the optimum working position with most present-day pulse tubes.

It provides an easy way to thermally contact shields whereby the shields could rest on (or be screwed onto) the thermal links.

External and internal surfaces of the pulse tube refrigerator could be thermally isolated and thus do not take part in the heat transfer process, and would therefore not obstruct the heat pumping effect.

The reduced wall thickness, e.g. due to external reinforcement could reduce the heat input due to conduction down the neck considerably: the neck cools itself.

The first and second stages would exchange heat at their contact locations, which means that the cooling enthalpy of the helium gas could help to reduce the pulse tube refrigerator power needed, The pulse tube refrigerator may be rigid, enabling it to carry shield weights and magnet loads.

It offers all the advantages a neck-tube offers, e.g. free opening in case of a quench, access to current leads and syphon, and at the same time shows a reduced window area due to the fact that there is only one turret necessary in the cryostat, as well as a reduced heat conduction.

It is the optimum thermal linking point or position.

The annulus could be opened from the top to exchange the regenerator material if necessary, although maintenance is not normally required.

The integrated fixed design is invisible to the customer and the patient.

Throughout the following description, like parts bear the same reference numerals in FIGS. 3 to 7.

Referring to FIG. 3A, a cut through section of one side of a neck-pulse tube refrigerator is shown where the pulse tube 30 and regenerator tube 32 are of annular shape, as shown in FIG. 3B, with the regenerator tube surrounding the pulse tube.

The arrangement comprises a first cooling stage 34 and a second cooling stage 36 including lead balls, the helium vessel 38 and the magnet 40. Helium boil-off gas flows in the direction of arrow A. At point 42, fixed current leads or diagnostic tubes are thermally linked to the neck of the cooler. A baffle system 44 is provided and thermally linked to the cooler and heat exchangers 46.

FIG. 4 shows an alternative arrangement to FIG. 3, where the regenerator tube 32 is surrounded by the pulse tube 30. An optional baffle system may be provided between the second stage 36 and the helium vessel 38. Thermal insulation is provided at point 50. The regenerator tube 32 may contain stainless steel mesh with lead balls 32a in the second cooling stage. The connections to an external valve box S are shown.

FIGS. 5A and B show a section of a neck-pulse tube refrigerator, where the pulse tube 30 and the regenerator tubes 32 are physcially located apart from each other.

FIGS. 6A and B show a section of a pulse tube refrigerator, where the pulse tubes 30 and the regenerator tubes 32 are of a circular shape and occupy a part or section of the neck tube 52.

FIGS. 7A and B show a section of a three-stage neck-pulse tube refrigerator, where the pulse tubes 30 and regenerator tubes 32 occupy a part or section of the neck-tube 52.

In this arrangement a third cooling stage 54 is provided, having a first and second sections 56,58 containing typically rare earth elements, e.g. Er3Ni, Nd respectively.

It will be appreciated by those skilled in the art that various modifications are possible that fall within the scope of the following claims. For example, the pulse tube or the regenerator tube could act as a suspension means.

The foregoing disclosure has been set forth merely to illustrate the invention and is not intended to be limiting.

Since modifications of the disclosed embodiments incorporating the spirit and substance of the invention may occur to persons skilled in the art, the invention should be construed to include everything within the scope of the appended claims and equivalents thereof.

What is claimed is:

1. An MRI or NMR system, comprising:
   a vessel containing a cooling liquid in an interior thereof, and having a neck tube with a longitudinally extending hollow bore that forms an orifice opening to said interior;
   a magnet assembly immersed in the cooling liquid; and
   a pulse tube refrigerator housed in the neck tube;
   wherein the pulse tube refrigerator comprises a tubular hollow cylindrical structure with a longitudinally extending hollow central bore that is open at both ends, and accesses the interior of the vessel.

2. The system according to claim 1, wherein the refrigerator comprises:
   an inner annulus having an inner surface that delimits the central bore, and an outer cylindrical surface; and
   an outer annulus having an inner surface in contact with the outer surface of the inner annulus, and an outer cylindrical surface.

3. The system according to claim 2, wherein:
   at least a sector of the inner annulus comprises a pulse tube; and
   at least a sector of the outer annulus comprises a regenerating tube.

4. The system according to claim 2, wherein:
   at least a sector of the outer annulus comprises a pulse tube; and
   at least a sector of the inner annulus comprises a regenerating tube.

5. The system according to claim 1, wherein:
   the tubular hollow cylindrical structure of the pulse tube refrigerator forms the neck tube, with the longitudinally extending central bore of the pulse tube refrigerator forming said orifice opening to said interior of said vessel; and
   the neck tube has inner and outer cylindrical surfaces, and incorporates a pulse tube and a regenerating tube between the inner and outer cylindrical surfaces.

6. The system according to claim 1, further comprising a bursting disk disposed in the central bore.

7. The system according to claim 1, further comprising a baffle system disposed in the central bore.

8. The system according to claim 1, wherein the pulse tube refrigerator has an artificially roughened surface structure.

9. The system according to claim 1, wherein at least one of the regenerating tube and pulse tube acts as a support element, for components of said system within said vessel.

10. The system according to claim 9, wherein the support element comprises a plurality of different direct contacts between a radiation shield within the vessel and the pulse tube refrigerator, whereby said radiation shield is supported by the pulse tube refrigerator.

11. The system according to claim 1, wherein the pulse tube refrigerator is coupled to support at least one of a radiation shield load and a magnet load within said vessel.

12. The system according to claim 1, wherein the neck-tube is made from a material selected from the group consisting of steel, titanium alloy and epoxy resin.

13. The system according to claim 1, wherein:
   the pulse tube refrigerator is multistage; and
   the neck-tube is a multistage element arranged to carry a load of at least one of a shield and a magnet.

14. The system according to claim 1, wherein the pulse tube further comprises a surface liner having a surface roughness that optimizes heat transfer and pressure drop through the pulse tube.

15. A cryogenic pulse tube refrigerator having a tubular hollow cylindrical structure formed along a longitudinal axis, said pulse tube refrigerator comprising:
   at least one pulse tube; and
   at least one regenerating tube;
   wherein said at least one pulse tube and said at least one regenerating tube are disposed about a longitudinally extending hollow central bore of said hollow cylindrical structure, which hollow central bore is open at both ends, and communicates between opposite ends of the cylindrical structure.

16. The pulse tube refrigerator according to claim 15, wherein the tubular hollow cylindrical structure comprises:
   an inner annulus having an inner surface that delimits the central bore, and an outer cylindrical surface; and
   an outer annulus having an inner surface in contact with the outer surface of the inner annulus, and an outer cylindrical surface.

17. The refrigerator according to claim 16, wherein:
   at least a sector of the inner annulus comprises a pulse tube; and
   at least a sector of the outer annulus comprises a regenerating tube.

18. The refrigerator according to claim 1, wherein:
   at least a sector of the outer annulus comprises a pulse tube; and
   at least a sector of the inner annulus comprises a regenerating tube.

19. The refrigerator according to claim 15, wherein the tubular hollow cylindrical structure of the pulse tube refrigerator forms a neck tube that has inner and outer cylindrical surfaces, and incorporates a pulse tube and a regenerating tube between the inner and outer cylindrical surfaces.

20. The refrigerator according to claim 15, further comprising a bursting disk disposed in the central bore.

21. The refrigerator according to claim 15, further comprising a baffle system disposed in the central bore.

22. The refrigerator according to claim 15, wherein the pulse tube refrigerator has an artificially roughened surface structure.

23. The refrigerator according to claim 15, wherein:
   the pulse tube refrigerator is multistage; and
   the neck-tube is a multistage element arranged to carry a load of at least one of a shield and a magnet.

24. The refrigerator according to claim 15, wherein the pulse tube further comprises a surface liner having a surface roughness that optimizes heat transfer and pressure drop through the pulse tube.

* * * * *